(12) United States Patent
Crockett et al.

(10) Patent No.: US 7,626,399 B2
(45) Date of Patent: Dec. 1, 2009

(54) BROKEN LEAD DETECTION

(75) Inventors: Jeffrey David Crockett, Adamstown, MD (US); Paul Thomas Parnell, Roanoke, VA (US); Stephen Hengen, Blacksburg, VA (US)

(73) Assignee: Acterna LLC, Germantown, MD (US)

( * ) Notice: Subject to any disclaimer, the term of this patent is extended or adjusted under 35 U.S.C. 154(b) by 245 days.

(21) Appl. No.: 11/941,469

(22) Filed: Nov. 16, 2007

(65) Prior Publication Data
US 2008/0116900 A1    May 22, 2008

Related U.S. Application Data

(60) Provisional application No. 60/866,333, filed on Nov. 17, 2006.

(51) Int. Cl.
   *G01R 31/02*    (2006.01)
   *H04M 3/08*    (2006.01)
(52) U.S. Cl. ............................ 324/539; 324/537; 379/2

(58) Field of Classification Search ................. 324/539, 324/537, 500, 521, 522, 650, 683, 709, 66, 324/76.52, 76.77, 76.11, 71.1; 379/1.04, 379/2, 22.03, 22.07, 29.03, 22, 29.04, 23, 379/414
See application file for complete search history.

(56) References Cited

U.S. PATENT DOCUMENTS

| | | | | |
|---|---|---|---|---|
| 4,871,971 A | * | 10/1989 | Jeerings et al. | 324/509 |
| 5,677,633 A | * | 10/1997 | Moser et al. | 324/539 |
| 6,249,127 B1 | * | 6/2001 | Fluhrer | 324/543 |
| 2008/0253556 A1 | * | 10/2008 | Cobb et al. | 379/442 |

* cited by examiner

*Primary Examiner*—Hoai-an D Nguyen
(74) *Attorney, Agent, or Firm*—Pequignot + Myers LLC; Matthew A. Pequignot

(57) ABSTRACT

The present invention relates to a broken lead testing device for determining whether a lead in a balanced lead pair of a datacom circuit is broken or faulty. Terminated leads are subjected to a phase difference and/or a voltage difference test, while unterminated leads are subjected to a current injection test.

14 Claims, 5 Drawing Sheets

BROKEN LEAD DETECTION

CROSS-REFERENCE TO RELATED APPLICATIONS

The present invention claims priority from U.S. Patent Application No. 60/866,333 filed Nov. 17, 2006, which is incorporated herein by reference for all purposes.

TECHNICAL FIELD

The present invention relates to detecting broken or faulty leads, and in particular to a broken lead detector device for detecting a broken or faulty lead in a differential pair of datacom leads.

BACKGROUND OF THE INVENTION

In a balanced line interface, a pair of wires, i.e. lines A and B, is used to carry each datacom signal, and the data is encoded and decoded as a differential voltage between the two lines. A typical truth table for a balanced interface is as follows:

$V_A - V_B < -0.2v = 0$ $V_A - V_B > +0.2v = 1$

In principle, as a differential voltage, the balanced line interface is unaffected by differences in ground voltage between sender and receiver. Furthermore, if lines A and B are close together, they will be affected almost identically by external electromagnetic noise. If the lines A and B are also twisted together, e.g. a "twisted pair", then neither line is permanently closer to a noise source than the other, which is extremely effective in eliminating noise from the signal.

V. 11 and V.35 are specifications which defines the connector type, the pin allocation and the signal level used for synchronous communications interfaces. The V.11 and V.35 specifications define differential interfaces for the clock and data signals, which are the only signals requiring high switching speeds for high-speed communications, e.g. up to 10 Mbps dependent on the equipment and cable used. However, 64 Kbps, 128 Kbps and 256 Kbps are other commonly used bit-rates. Separate clock lines are provided for receiving and transmitting data, and the remaining signals defined in the V.11 and V.35 specifications are unbalanced, i.e. single wire, and typically require minimal changes of state. Typical protocols used over V.11 and V.35 interfaces are HDLC, X.25, SNA and PPP.

A broken lead is the event when a datacom signal has high impedance or is open between the receiver and the external transmitter. A faulted lead is a condition when there is a fault in the differential pair between the receiver and transmitter such as a broken lead, low differential voltage, or a short.

An object of the present invention is to overcome the shortcomings of the prior art by providing a broken lead detector for a balanced datacom signal.

SUMMARY OF THE INVENTION

Accordingly, the present invention relates to a broken lead detector for determining whether a datacom connection has a faulty lead comprising:

a connector for receiving a datacom signal including a plurality of pairs of balanced received signals on a plurality of matching pairs of A and B leads;

a switching device enabling a selection of which matching pair of leads is to be connected, and which balanced signals is to be tested;

an analog to digital converter for converting the selected balanced signals into digital signals;

a phase detector module for determining whether the selected pair of balanced terminated signals are in phase, indicative of a faulty lead;

an average difference module for determining whether a differential voltage between the selected pair of balanced terminated signals is less than a predetermined threshold, indicative of a faulty lead;

a master control for controlling the phase detector module and average difference module for outputting results from the phase detector and average difference modules indicating a faulty lead; and a user interface enabling input of control signals to the phase detector module, and the average difference module, and an output of test data from the modules.

Another aspect of the present invention relates to a method for determining whether a datacom connection has a faulty lead comprising the steps of:

a) connecting a plurality of matching pairs of A and B leads, which are transmitting a datacom signal including a plurality of pairs of balanced signals;

b) selecting which matching pair of leads is to be connected, and which balanced signals is to be tested;

c) determining whether the selected pair of balanced terminated signals are in phase, indicative of a faulty lead;

d) determining whether a differential voltage between the selected pair of balanced signals is less than a predetermined threshold, indicative of a faulty lead;

e) outputting results on a user interface from steps c) and d), if a faulty lead is detected; and f) repeating steps b) to e) for additional pairs of the plurality of pairs of balanced leads.

BRIEF DESCRIPTION OF THE DRAWINGS

The invention will be described in greater detail with reference to the accompanying drawings which represent preferred embodiments thereof, wherein.

DETAILED DESCRIPTION

Figure 1A:
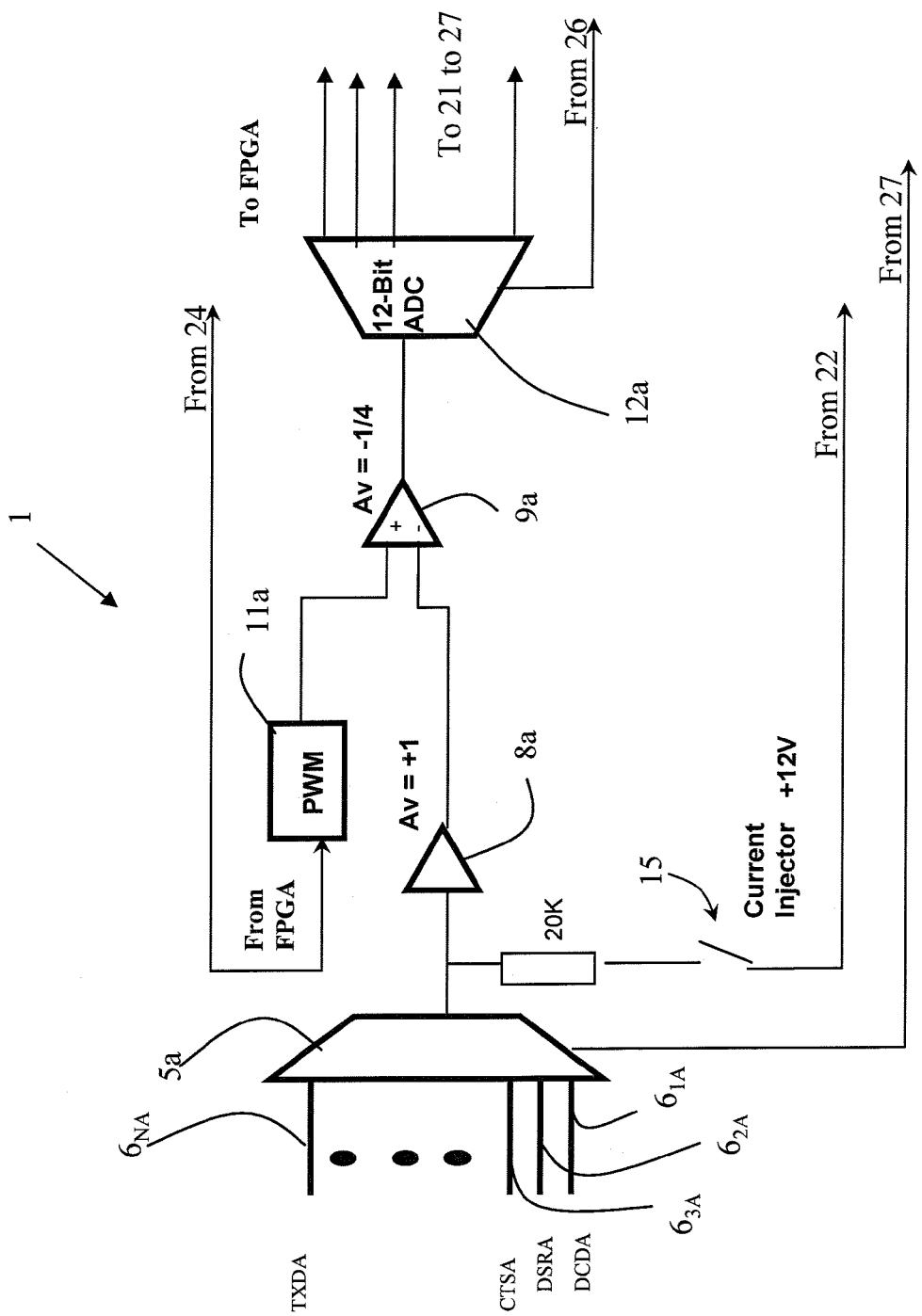
FIGS. 1a and 1b illustrates side and top views, respectively, of a datacom interface for the datacom broken lead detector of the present invention.
Figure 1B:
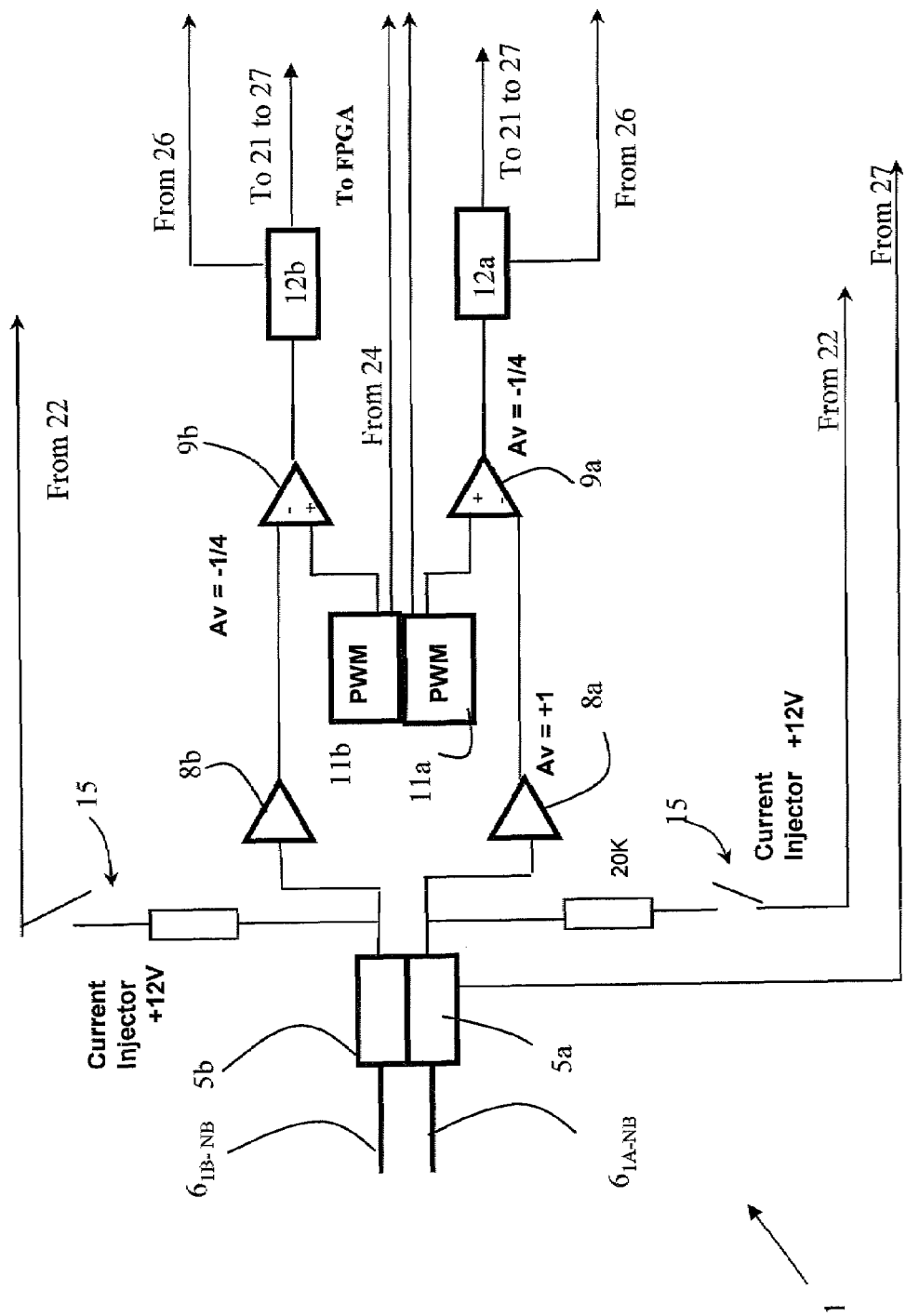

With reference to FIGS. 1a and 1b, the balanced datacom broken lead detector according to the present invention evaluates the receive balanced, e.g. V.11 (RS530, RS449, RS422, V.21), V.35 or MIL188-114, signals for a broken or faulted signal pair, i.e. a faulted lead. The balanced datacom broken lead detector includes a datacom receiver/interface generally indicated at 1 in the form of first and second analog switches 5a and 5b including a plurality of connector ports for receiving and electrically connecting all of the balanced and unbalanced datacom A and B leads $6_{1A}$ to $6_{NA}$ and $6_{1B}$ to $6_{NB}$, respectively. The broken lead detector also includes a pair of first and second operational amplifiers 8a, 9a and 8b, 9b, pulse width modulators (PWM) 11a and 11b, first and second analog to digital converters (ADC) 12a and 12b, and a field programmable gate array (FPGA) 20, illustrated in FIG. 2. Each set of leads, i.e. leads A and B, requires their own analog switch 5a or 5b, first and second amplifiers 8a and 9a or 8b and 9b, a PWM 11a or 11b, and an analog to digital converter 12a or 12b; however, the FPGA 20 are common to both sets of A and B leads. The inputs to the first and second analog switches 5a and 5b are all the balanced and unbalanced datacom leads; however, only the balanced leads are tested in accordance with the present invention. The outputs of the FPGA 20 are the Broken A lead and Broken B lead status indicators.

The datacom signals from the balanced and unbalanced datacom leads $6_{1A}$ to $6_{NA}$ are connected to the analog switch 5a, e.g. a 16:1 analog switch, which is used to sequentially select one of the balanced datacom leads $6_1$ to $6_{NA}$ to transmit a datacom signal to be tested, along with a corresponding lead from the second analog switch 5b. The following table is an example of a set of leads connected to the first and second analog switches 5a and 5b with designations well known in the art. The possible connectors include 9 pin, 25 pin and 37 pin connectors. The first and second switches 5a and 5b select the matching pair of balanced leads for simultaneous testing thereof, e.g. A-lead NO3 DCDA and B-Lead NO3 DCDB, and then proceeds to select all of the matching pairs in sequence, e.g. A-lead NO4 DSRA and B-Lead NO4 DSRB, then A-lead NO5 CTSA and B-Lead NO5 CTSB.

window, e.g. 2 Volts, of the ADCs 12a and 12b, since there could be a common mode voltage of +7 to −7 volts. The output of the second operational amplifiers 9a and 9b are connected to the ADC's 12a and 12b, respectively, e.g. a 12-bit 20 MHz analog to digital converter. The digital outputs of the first and second ADCs 12a and 12b are connected to the FPGA 20.

Figure 2:
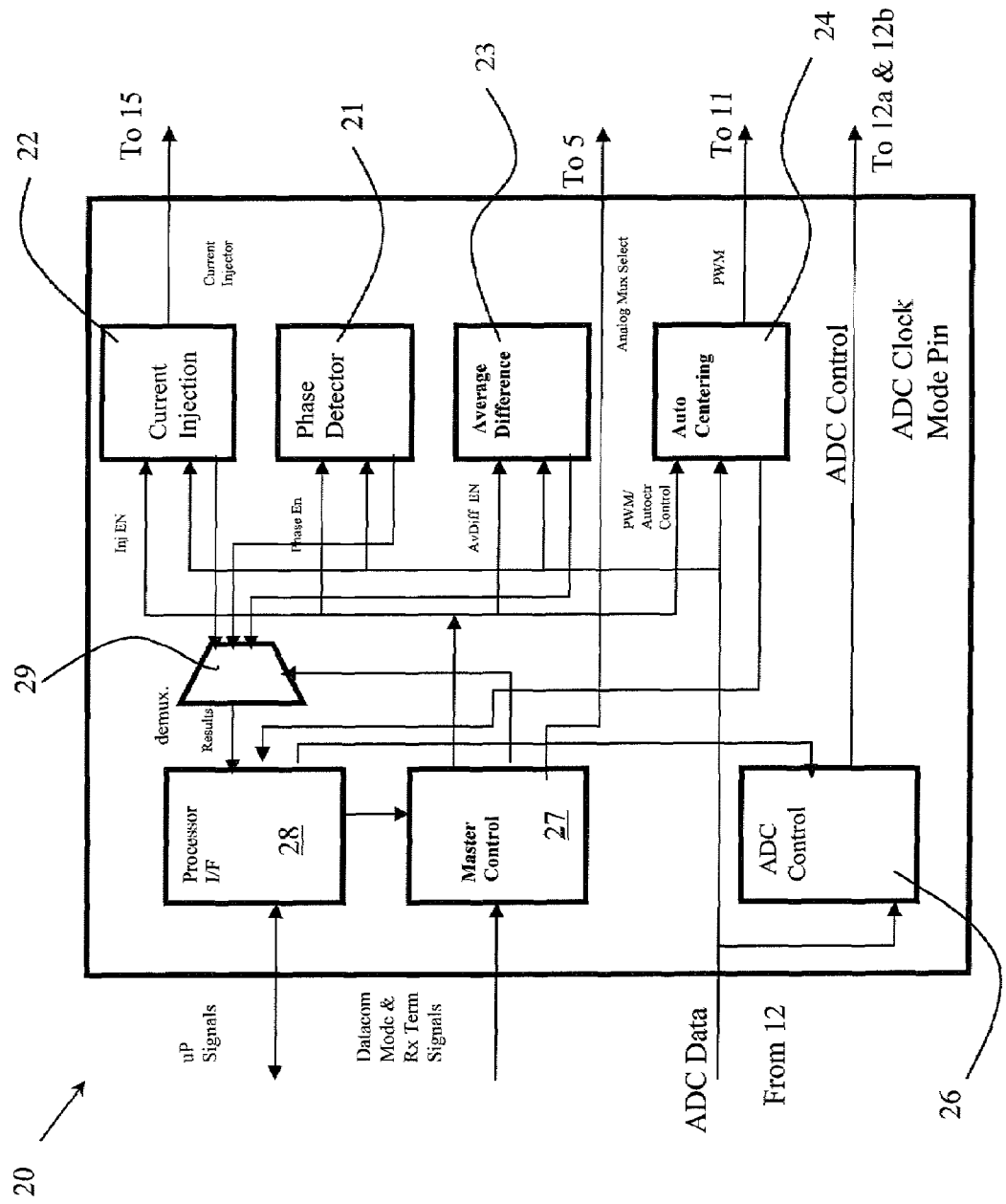
FIG. 2 illustrates a field programmable gate array for the datacom broken lead detector of the present invention.

With reference to FIG. 2, in order to evaluate faulted or broken leads over the entire bandwidth of DC to 20 MBit/s (20 MHz clock signal), three primary algorithms are used in the FPGA 20. The three modules which perform the three primary algorithms are a phase detector module 21, a current injection module 22, and an average difference module 23. The phase detector and the average difference modules 21 and 23, respectively, evaluate the presence of a faulted lead. The current injection module 22 determines which lead is broken. An additional module 24 called "auto centering" adjusts the DC bias to handle the wide common mode range of the datacom, e.g. V.11, signals by controlling the pulse width modulator (PWM) 11. The auto centering module 24 controls the pulse width modulator (PWM) 11 hardware by adjusting the duty cycle of a square wave. The duty cycle of the square wave will control the DC offset of the PWM hardware output.

The phase detector module 21 evaluates the balanced datacom lead pair's phase to detect a broken (faulted) lead. The current injection module 22 evaluates the balanced datacom

| | A-Lead Mux | | | | | B-Lead Mux | | | |
|---|---|---|---|---|---|---|---|---|---|
| Input | Select (A3A2A1A0) (Hex) | Signal | Balanced | RefDes | Input | Select (A3A2A1A0) (Hex) | Signal | Input | RefDes |
| NO1 | 0 | TMA | no | U602 | NO1 | 0 | +3.3 VDC | no | U613 |
| NO2 | 1 | RNG | no | U602 | NO2 | 1 | +5.0 VDC | no | U613 |
| NO3 | 2 | DCDA | yes | U602 | NO3 | 2 | DCDB | yes | U613 |
| NO4 | 3 | DSRA | yes | U602 | NO4 | 3 | DSRB | yes | U613 |
| NO5 | 4 | CTSA | yes | U602 | NO5 | 4 | CTSB | yes | U613 |
| NO6 | 5 | STCA | yes | U602 | NO6 | 5 | STCB | yes | U613 |
| NO7 | 6 | RXCA | yes | U602 | NO7 | 6 | RXCB | yes | U613 |
| NO8 | 7 | RXDA | yes | U602 | NO8 | 7 | RXDB | yes | U613 |
| NO9 | 8 | LLR | no | U602 | NO9 | 8 | LLR | no | U613 |
| NO10 | 9 | RLR | no | U602 | NO10 | 9 | RLR | no | U613 |
| NO11 | a | Ground | no | U602 | NO11 | a | Ground | no | U613 |
| NO12 | b | DTRA | yes | U602 | NO12 | b | DTRB | yes | U613 |
| NO13 | c | RTSA | yes | U602 | NO13 | c | RTSB | yes | U613 |
| NO14 | d | Ground | no | U602 | NO14 | d | Ground | no | U613 |
| NO15 | e | TXCA | yes | U602 | NO15 | e | TXCB | yes | U613 |
| NO16 | f | TXDA | yes | U602 | NO16 | f | TXDB | yes | U613 |

The first operational amplifiers 8a and 8b are used as a high impedance unity gain amplifier so that the selected datacom signal does not violate the impedance specification of the datacom receiver, e.g. a V.11 receiver provided. The datacom receiver can receive data with a voltage between −15 VDC and +15 VDC with respect to ground, which varies depending on the specification used, e.g. V.11 has a common mode voltage of between +7 and −7 VDC, while V.35 has a common mode voltage of less than +1 VDC. Because of the variance in common mode voltages (DC offset), a PWM 11 is needed to offset the DC voltage, so that the signal can be presented to the ADC's 12a and 12b. The output of the analog switches 5a and 5b are summed with the DC bias generated by the PWM 11. The second operational amplifiers 9a and 9b are used as both a negative attenuator and a summer of the output bias of the PWM 11, which is required to fit the data into a voltage lead pair for a broken lead by injecting a current via one of the current injectors 15 into the selected lead and measuring the voltage change from the current injection. The average difference module 23 evaluates for a broken (faulted) lead by measuring the voltage difference of the selected signal pair. A small voltage difference indicates there is a faulted or possible broken lead.

An ADC control module 26 controls the interface to the analog to digital converters 12a and 12b. The ADC control module 26 also controls the data acquisition from the ADCs 12a and 12b, the sampling rate of the ADCs 12a and 12b, and the acquisition of ADC data into an on-board FPGA RAM (not shown).

A master control module 27 is the master control module for determining which state each of the other modules 21 to 26 are in. The master control module 27 decides which modules are active and when, and also controls the first and second analog switches 5a and 5b, which selects the balanced signal pair being evaluated. The master control module 27 receives input signals from both a datacom control chain section of the FPGA 20 and a processor interface 28. The datacom control chain is a serial protocol which controls many external shift registers on the datacom (Upper) board, since the FPGA 20 is on the main board. The master control module 27 monitors signals, such as the mode selection, termination, emulation selection, and broken lead detection enable/reset. All of the control, except the enable and reset, comes from the datacom control chain. The reset/enable signals come from the processor interface module 28. The processor interface module 28 receives signals from a microprocessor, found in the testing equipment control, and is used for reporting the results of the broken lead detector to software as well as responding to software enabling/disabling the broken lead detector of the present invention.

A demux module 29 is a synchronous demux which latches the results from the average difference module 23, the phase detector module 21, and the current injection module 22 into the appropriate datacom bit. The result is latched after each datacom signal pair is evaluated. The select of the demux module 29 is also selected to one of possible n positions, e.g. sixteen, depending on which lead is being evaluated.

Preferably, the interface 1 and the FPGA 20 are interconnected such that the interface 1 is a sub-module of a FB8000 main board FPGA. In addition to broken lead detection, the main board FPGA handles the datacom results and control between the software and the board level.

The present invention evaluates a broken or faulted lead of a signal depending on whether the signal is terminated or unterminated. Accordingly, the first step performed by the present invention is to determine whether the selected pair of leads are terminated or unterminated. The Broken Lead module of the present invention reads the Control Chain module in the FPGA 20 to determine the receiver termination status. The termination status information is fed into the Master Control block 27 and controls the state machine.

If the receive signals are terminated, the present invention determines if there is a faulted lead by calculating the relative phase difference between the A and B leads using the phase detector module 21 and/or by measuring the average difference over a plurality of samples, e.g. greater than 1000 samples, preferably more than 2000 samples, such as 2048 samples, between the A and B leads utilizing the average difference module 23. If both the signals on the A and B leads are either in phase or have a differential voltage less than a predetermined threshold, e.g. 300 mV in V.11 or 150 mV in V.35, a faulted lead is detected. If either one of the aforementioned methods detects a faulted lead, a faulted lead is reported to the master control processor 27, which will utilize software to provide an indication, e.g. display and/or alarm, indicative of the fault. The phase detector method works better for changing datacom signals, such as data and clocks, than the average difference method; however, the phase detector method cannot evaluate DC or non-changing signals, such as the control signals. The average difference method works well for terminated non-changing signals, e.g. transmitting a mark or space on the data when the receiver is terminated.

Figure 3:
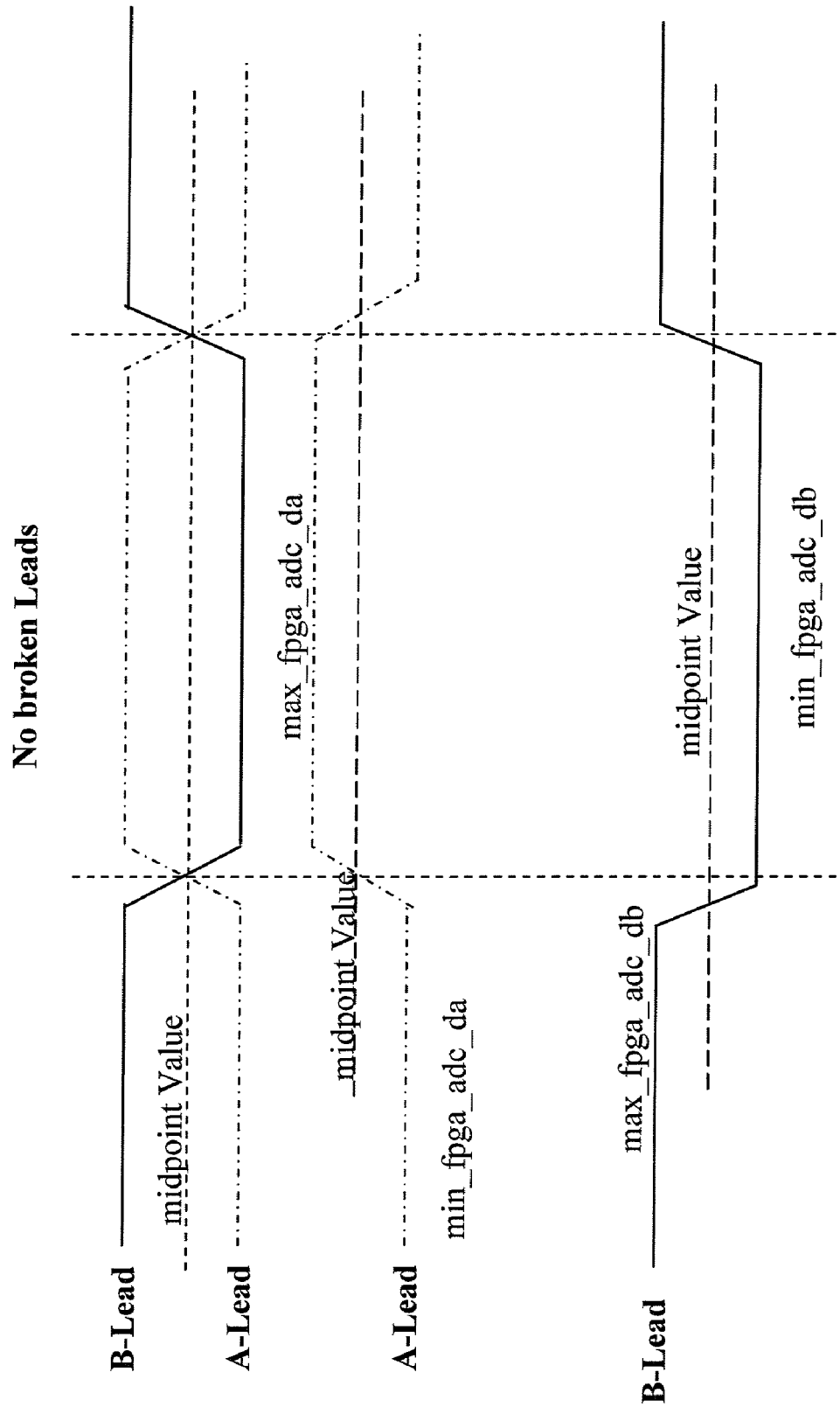
FIG. 3 graphically illustrates minimum and maximum voltages for A and B lead signals without faults.

With reference to FIG. 3, the phase detector 21 uses the following steps to determine the phase for determining whether a lead is faulty:

First, the phase detector 21 finds the average (midpoint) of the voltage of the A lead ($V_a$) and the voltage of the B lead ($V_b$) over a large number of samples, e.g. greater than 1000 samples, preferably more than 2000 samples, such as 2048 samples, from the ADCs 12a and 12b, whereby the average (or common mode) should be close to 0.

Second, each sample from the ADCs 12a and 12b is added to a maximum or a minimum accumulator based on the relative values therebetween, for example: if the $V_a$ sample value is less than the midpoint value, i.e. negative or at a minimum, the sample value or a difference between the sample value $V_a$ and the midpoint voltage is stored in a $V_a$ min accumulator. Simultaneously, the $V_b$ sample value, or a difference between the $V_b$ sample value and the midpoint voltage is stored in a $V_b$ max accumulator, since the assumption is made that when the A-lead is at a minimum or negative value the B-lead will be at a maximum or positive value. However, if the $V_a$ sample value is greater than or equal to the midpoint, i.e. positive, the sample value $V_a$ or the difference ($V_a$—midpoint value) is stored in a $V_a$ max accumulator, while the $V_b$ sample value or the difference ($V_b$—midpoint value) is stored in a $V_b$ min accumulator, because the assumption is made that when the A-lead is at a maximum or positive value the B-lead will be at a minimum or negative value.

Third, the average values from the $V_a$ min accumulator, $V_b$ min accumulator, $V_a$ max accumulator, and $V_b$ max accumulator are determined.

Fourth the phase detector 21 measures the phase by adding the following averages from the aforementioned accumulators: if $V_a$ max+$V_b$ min<|$V_a$ max| and $V_a$ min+$V_b$ max<|$V_a$ max| the signal pair being tested is good. Otherwise the signal has a broken lead.

Fifth, if any of the four accummulators are not filled with a predetermined number of samples, e.g. 1024 samples, in a predetermined time, e.g. 30 ms, the phase detector module 21 times out and does not indicate a fault.

Figure 4:
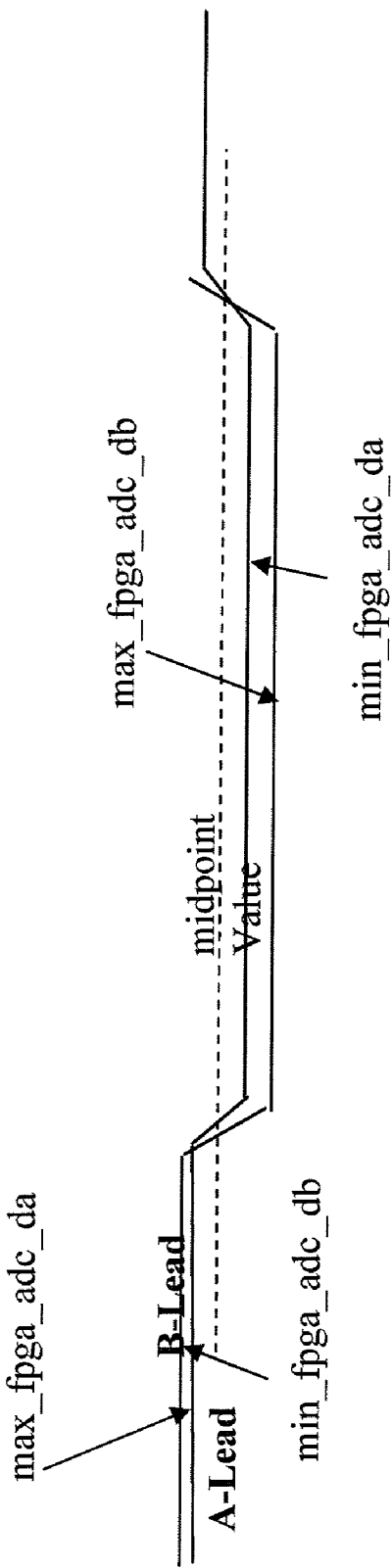
FIG. 4 graphically illustrates minimum and maximum voltages for A and B lead signals with faults.

The maximum and minimum accumulators are used for phase detection because when balanced signals centered at 0 V are not broken or faulted, the sum of the high level and low level will be close to 0 (see FIG. 3). However, if either lead is broken, the leads will be in phase, and therefore will have a cumulative absolute value greater than either individual value. In FIG. 4, the line "midpoint value" is the calculated average. If the average maximum and minimum values ($V_a$ max, $V_b$ min, $V_b$ max and $V_a$ min) are obtained as in FIG. 4, the sum of the lead amplitudes ($V_a$ max+$V_b$ min or $V_a$ min+$V_b$ max) will be greater than the absolute value of either lead, because at the same instant in time, both A-Lead and B-Lead samples will either both be positive or both be negative. When there is a broken (faulted) lead, it is possible that the B-Lead value minimum value may be greater than the average value or vice-versa, as illustrated in FIG. 3.

When the receive inputs are unterminated, i.e. has an impedance greater than a predetermined threshold, e.g. 4000 ohms, between the balanced leads (no termination selected at the receiver), such as the balanced control signals, a small current (e.g. <1 mA) is injected into one of the selected A or B leads by one of the current injectors 15, and the voltage change is compared. If the voltage change caused by the current injector 15 becomes greater than a determined threshold, e.g. 122 mV, the selected lead is determined to be broken. If the lead being tested is not broken, the 50 ohm output impedance of the remote transmitter will sink the injected current and result in a minimal voltage deflection, e.g. less than 122 mV. In operation, the current injection method includes the FPGA 20 activating the current injector, e.g. a MOSFET, 15, which switches 12 VDC to a 20 kΩ resistor in series with the selected datacom lead. The voltage change is read by the A-Lead or B-Lead analog to digital converter 12a or 12b and relayed to the master controller 27. If the aforementioned method detects a broken or faulted lead, a faulted lead is reported to the master control processor 27, which will utilize software to provide an indication, e.g. display and/or alarm, indicative of the fault.

We claim:

1. A broken lead detector for determining whether a datacom connection has a faulty lead comprising:
   a connector for receiving a datacom signal including a plurality of pairs of balanced received signals on a plurality of matching pairs of A and B leads;
   a switching device enabling a selection of which matching pair of leads is to be connected, and which balanced signals is to be tested;
   an analog to digital converter for converting the selected balanced signals into digital signals;
   a phase detector module for determining whether the selected pair of balanced terminated signals are in phase, indicative of a faulty lead;
   an average difference module for determining whether a differential voltage between the selected pair of balanced terminated signals is less than a predetermined threshold, indicative of a faulty lead;
   a master control for controlling the phase detector module and average difference module for outputting results from the phase detector and average difference modules indicating a faulty lead; and
   a user interface enabling input of control signals to the phase detector module, and the average difference module, and an output of test data from the modules.

2. The detector according to claim 1, further comprising:
   a termination detector to determine whether the selected pair of balanced received signals are terminated or unterminated; and
   a current injection module for injecting current into one of the selected pair of balanced unterminated signals, and determining whether a voltage change in the selected signal caused by the current injector is greater than a determined threshold, indicative of a broken lead.

3. The detector according to claim 1, wherein the average difference module determines whether the selected pair of balanced signals has a differential voltage less than a predetermined threshold by measuring an average differential voltage over a plurality of samples.

4. The detector according to claim 1, wherein the current injection module includes a current injector comprising a voltage source and a resistance for injecting a current into one of the selected pairs of leads.

5. The detector according to claim 1, wherein the phase detector module:
   determines an average voltage for a plurality of samples of the selected balanced pair of signals;
   determines an average maximum A-lead voltage and an average minimum B-lead voltage, when the A lead is greater than the average voltage, for a plurality of samples,
   determines an average minimum A-lead voltage and an average maximum B-lead voltage, when the A lead is less than the average voltage, for a plurality of samples,
   determines whether a sum of the average maximum A-lead voltage and the average minimum B-lead voltage is greater than the absolute value of the average maximum A-lead voltage, which is indicative of a faulty lead, and
   determines whether a sum of the average minimum A-lead voltage and the average maximum B-lead voltage is greater than the absolute value of the average maximum A-lead voltage, which is indicative of a faulty lead.

6. The detector according to claim 1, wherein the switching device sequentially selects all of the matching pairs of A and B leads for testing.

7. The detector according to claim 1, further comprising auto centering module for adjusting the DC bias of the selected balanced signals to ensure the voltage of the selected balanced signals is within a predetermined voltage window for compensating for a wide common mode range of the selected balanced signals.

8. A method for determining whether a datacom connection has a faulty lead comprising the steps of:
   a) connecting a plurality of matching pairs of A and B leads, which are transmitting a datacom signal including a plurality of pairs of balanced signals;
   b) selecting which matching pair of leads is to be connected, and which balanced signals is to be tested;
   c) determining whether the selected pair of balanced terminated signals are in phase, indicative of a faulty lead;
   d) determining whether a differential voltage between the selected pair of balanced signals is less than a predetermined threshold, indicative of a faulty lead;
   e) outputting results on a user interface from steps c) and d), if a faulty lead is detected; and
   f) repeating steps b) to e) for additional pairs of the plurality of pairs of balanced leads.

9. The method according to claim 8, further comprising:
   g) determining whether the selected pair of balanced signals are terminated or unterminated;
   h) injecting current into one of the selected pair of balanced unterminated signals, and determining whether a voltage change in the selected signal caused by the current injector is greater than a determined threshold, indicative of a broken lead;
   i) outputting results on the user interface from step g) if a broken lead is detected; and
   j) repeating steps g) and i) for additional pairs of the plurality of pairs of balanced leads.

10. The detector according to claim 9, wherein step h) includes providing a current injector comprising a voltage source and a resistance for injecting a current into one of the selected pairs of leads.

11. The method according to claim 8, wherein step d) includes determining measuring an average differential voltage over a plurality of samples of the balanced signals.

12. The detector according to claim 8, wherein step c) includes:
   determining an average voltage for a plurality of samples of the selected balanced pair of signals;
   determining an average maximum A-lead voltage and an average minimum B-lead voltage, when the A lead is greater than the average voltage, for a plurality of samples,
   determining an average minimum A-lead voltage and an average maximum B-lead voltage, when the A lead is less than the average voltage, for a plurality of samples,
   determining whether a sum of the average maximum A-lead voltage and the average minimum B-lead voltage is greater than the absolute value of the average maximum A-lead voltage, which is indicative of a faulty lead, and
   determining whether a sum of the average minimum A-lead voltage and the average maximum B-lead voltage is greater than the absolute value of the average maximum A-lead voltage, which is indicative of a faulty lead.

13. The detector according to claim 8, wherein step b) includes sequentially selects all of the matching pairs of A and B leads for testing.

14. The detector according to claim 8, wherein step a) includes adjusting the DC bias of the selected balanced signals to ensure the voltage of the selected balanced signals is within a predetermined voltage window for compensating for a wide common mode range of the selected balanced signals.

* * * * *